US010519542B2

(12) United States Patent
Yamasaki et al.

(10) Patent No.: US 10,519,542 B2
(45) Date of Patent: Dec. 31, 2019

(54) PURGING METHOD

(71) Applicant: TOKYO ELECTRON LIMITED, Tokyo (JP)

(72) Inventors: Hideaki Yamasaki, Nirasaki (JP); Takeshi Itatani, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/847,980

(22) Filed: Dec. 20, 2017

(65) Prior Publication Data

US 2018/0179627 A1 Jun. 28, 2018

(30) Foreign Application Priority Data

Dec. 27, 2016 (JP) .................................. 2016-253487

(51) Int. Cl.
| | |
|---|---|
| *C23C 16/44* | (2006.01) |
| *H01L 21/673* | (2006.01) |
| *H01L 21/687* | (2006.01) |
| *H01L 21/67* | (2006.01) |
| *C23C 16/458* | (2006.01) |

(52) U.S. Cl.
CPC ...... *C23C 16/4408* (2013.01); *C23C 16/4586* (2013.01); *H01L 21/67017* (2013.01); *H01L 21/67386* (2013.01); *H01L 21/67393* (2013.01); *H01L 21/68792* (2013.01); *H01L 21/67103* (2013.01); *H01L 21/68742* (2013.01)

(58) Field of Classification Search
CPC ............ C23C 16/4408; C23C 16/4586; H01L 21/67017; H01L 21/67393; H01L 21/67386; H01L 21/68792; H01L 21/67103; H01L 21/68742
See application file for complete search history.

(56) References Cited

U.S. PATENT DOCUMENTS

| | | | |
|---|---|---|---|
| 6,803,546 B1 * | 10/2004 | Boas | C30B 25/10 118/50.1 |
| 7,713,318 B2 * | 5/2010 | Fujihara | B01J 8/0492 423/655 |
| 7,727,908 B2 * | 6/2010 | Ahn | C23C 16/308 438/785 |

(Continued)

FOREIGN PATENT DOCUMENTS

| | | |
|---|---|---|
| JP | 2006173299 A | 6/2006 |
| JP | 2014-198872 A | 10/2014 |

(Continued)

*Primary Examiner* — William Coleman
(74) *Attorney, Agent, or Firm* — Nath, Goldberg & Meyer; Jerald L. Meyer; Tanya E. Harkins

(57) ABSTRACT

A purging method for purging an interior of a processing container of a substrate processing apparatus after a film forming process is executed on a wafer in the processing container, includes a first process of pressurizing a first gas in a first line of the substrate processing apparatus and then discharging the first gas into the processing container, and a second process of supplying a second gas into the processing container. The second process is executed after execution of the first process, the first gas includes an inert gas, and the second gas includes a hydrogen gas, a nitrogen-containing gas, a rare gas or a combination of these gases.

18 Claims, 11 Drawing Sheets

(56) References Cited

U.S. PATENT DOCUMENTS

| | | | | |
|---|---|---|---|---|
| 8,008,214 | B2* | 8/2011 | Jee | H01L 21/0217 |
| | | | | 257/E21.285 |
| 9,238,257 | B2* | 1/2016 | Sakai | B08B 7/00 |
| 10,224,224 | B2* | 3/2019 | Liang | C23C 16/52 |
| 2007/0006800 | A1* | 1/2007 | Lee | C23C 16/4408 |
| | | | | 117/95 |
| 2007/0251445 | A1* | 11/2007 | Ishizaka | C23C 16/0281 |
| | | | | 117/92 |
| 2014/0147589 | A1* | 5/2014 | Khandelwal | C23C 16/0281 |
| | | | | 427/250 |
| 2016/0071722 | A1* | 3/2016 | Miura | C23C 16/45551 |
| | | | | 438/694 |
| 2017/0283945 | A1* | 10/2017 | Yahata | C23C 16/46 |

FOREIGN PATENT DOCUMENTS

| | | |
|---|---|---|
| JP | 2014-199856 A | 10/2014 |
| KR | 10-2005-0108954 A | 11/2005 |

* cited by examiner

PURGING METHOD

CROSS-REFERENCE TO RELATED APPLICATION

This application is based upon and claims the benefit of priority from Japanese Patent Application No. 2016-253487, filed on Dec. 27, 2016, the entire contents of which are incorporated herein by reference.

TECHNICAL FIELD

The present disclosure relates to a purging method.

BACKGROUND

In a process of depositing a film on a wafer in a processing container of a film forming apparatus, a film may adhere to the inside of the processing container in some cases. In such a process, for example, a film forming process of a metal film or an insulating film may be performed in some cases. When replacing a film-formed wafer with an unprocessed wafer after the film forming process, a plurality of particles may adhere to the surface of the wafer in the case of unloading the processed wafer or loading the unprocessed wafer. For example, there is known a technique for reducing the plurality of particles adhering to the wafer surface as described above.

In the prior art, a film forming apparatus that sequentially supplies plural types of reaction gases reacting with each other to a wafer in a processing container kept in a vacuum atmosphere performs a film forming process of a thin film formation and unloads a wafer. Thereafter, particles adhered to the portions making contact with the reaction gases are removed by the flow of a purge gas. The pressure of the purge gas is increased to above the pressure available at the time of pressurization of the reaction gases by using a pressurization-purpose storage tank for initially pressurizing the reaction gases and then discharging the reaction gases into the processing container. Thereafter, the purge gas is supplied into the processing container. Therefore, due to the strong flow of the purge gas, the particles existing in a flow path on the downstream side of the storage tank are caused to flow and are removed together with the purge gas. This makes it possible to reduce the particles adhering to the processing container.

Furthermore, in the prior art, a wafer boat holding wafers W mounted thereon is loaded into a reaction vessel. The interior of the reaction vessel is set to a vacuum atmosphere. Then, a dichlorosilane gas is pressurized in a storage tank. Thereafter, a film forming process of a SiN film is performed by alternately performing a step of supplying the dichlorosilane gas to the reaction vessel and a step of supplying an ammonia gas to the reaction vessel. Next, the wafer boat is unloaded from the reaction vessel, the reaction vessel is closed with a lid, and a purging step is performed. In the purging step, the temperature of the reaction vessel is raised and then lowered. During the temperature lowering, an operation of storing and pressurizing a purge gas in a storage tank and discharging the purge gas to the reaction vessel is repeated a plurality of times. As a result, the thin film adhering to the inside of the reaction vessel is forcibly peeled off, and the particles existing in the flow path of the dichlorosilane gas are removed. This makes it possible to reduce particle contamination of the wafers W.

As described above, various purging processes for supplying a purge gas into a reaction vessel at a relatively high pressure have been developed so far in order to reduce particle contamination. However, a demand has existed for a technique regarding a purging process for more sufficiently reducing particle contamination.

SUMMARY

According to one embodiment of the present disclosure, there is provided a purging method for purging an interior of a processing container of a substrate processing apparatus after a film forming process is executed on a wafer in the processing container, including: a first process of pressurizing a first gas in a first line of the substrate processing apparatus and then discharging the first gas into the processing container; and a second process of supplying a second gas into the processing container, wherein the second process is executed after execution of the first process, the first gas includes an inert gas, and the second gas includes a hydrogen gas, a nitrogen-containing gas, a rare gas or a combination of these gases.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
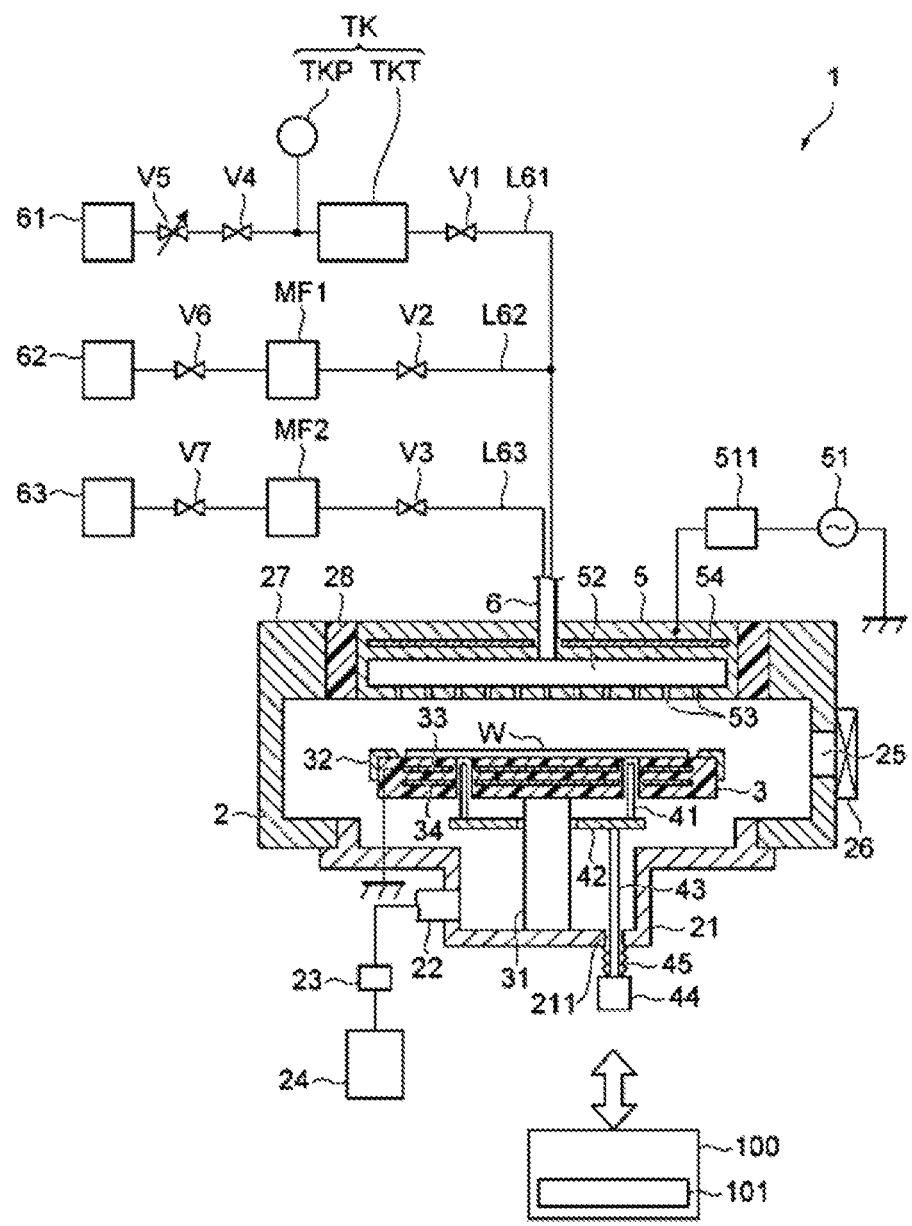
FIG. 1 is a view schematically showing a cross-sectional structure of a substrate processing apparatus in which a purging method of one embodiment can be performed.

Hereinafter, various embodiments will be described in detail with reference to the drawings. In each drawing, the same reference numerals are attached to the same or corresponding parts. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

FIG. 1 is a view schematically showing a cross-sectional structure of a substrate processing apparatus (substrate processing apparatus 1) in which a purging method (purging method MT) of one embodiment is performed. First, a configuration example of the substrate processing apparatus 1 will be described with reference to FIG. 1. The substrate processing apparatus 1 is an apparatus that performs a film forming process for forming, for example, a Ti film on an object to be processed (wafer W) by a plasma CVD method. The substrate processing apparatus 1 includes a substantially cylindrical airtight processing container 2. An exhaust chamber 21 is provided in the central portion of the bottom wall of the processing container 2.

The exhaust chamber 21 has, for example, a cylindrical shape protruding downward. An exhaust path 22 is connected to the exhaust chamber 21, for example, on a side surface of the exhaust chamber 21.

An exhaust part 24 is connected to the exhaust path 22 via a pressure regulation part 23. The pressure regulation part 23 includes, for example, a pressure regulation valve, for example, a butterfly valve. The exhaust path 22 is configured so that the interior of the processing container 2 can be depressurized by the exhaust part 24. On the side surface of the processing container 2, a transfer port 25 is provided. The transfer port 25 is configured to be opened and closed by a gate valve 26. The loading/unloading of the wafer W between the processing container 2 and the transfer chamber (not shown) is performed via the transfer port 25.

A mounting table 3 for substantially horizontally holding the wafer W is provided in the processing container 2. The mounting table 3 is supported by a support member 31. The mounting table 3 is made of ceramics such as, for example, aluminum nitride (AlN) or the like. The material of the mounting table 3 may be, for example, ceramics of aluminum nitride alone, but may also be a metallic material such as nickel or the like. A guide ring 32 is provided in the peripheral edge portion of the surface of the mounting table 3. The guide ring 32 is a member for guiding the wafer W. Instead of the guide ring 32, a recess having substantially the same size and shape as the wafer W may be provided on the mounting table 3.

On the mounting table 3, for example, a grounded lower electrode 33 is buried. A heating mechanism 34 is buried under the lower electrode 33. The heating mechanism 34 heats the wafer W mounted on the mounting table 3 to a preset temperature (e.g., a temperature of 400 degrees C. or higher) as electric power is supplied from a power supply part (not shown) based on a control signal from a control part 100. When the mounting table 3 is entirely made of a metal, the entire mounting table 3 acts as a lower electrode. Therefore, it is unnecessary to embed the lower electrode 33 in the mounting table 3. The mounting table 3 is provided with three or more lift pins 41 that form an elevating member for holding and elevating the wafer W placed on the mounting table 3. The material of the lift pins 41 may be ceramics such as alumina ($Al_2O_3$), quartz or the like. The lower ends of the lift pins 41 are attached to a support plate 42. The support plate 42 is connected to an elevating mechanism 44 provided outside the processing container 2 via an elevating shaft 43.

The elevating mechanism 44 is installed, for example, in the lower part of the exhaust chamber 21. A bellows body 45 is provided between an opening 211 for the elevating shaft 43 formed on the lower surface of the exhaust chamber 21 and the elevating mechanism 44. The shape of the support plate 42 may be a shape capable of moving up and down without interfering with the support member 31 of the mounting table 3. The lift pins 41 are configured to be vertically movable between the upper side of the surface of the mounting table 3 and the lower side of the surface of the mounting table 3 by the elevating mechanism 44.

A gas supply part 5 is provided on a top wall 27 of the processing container 2 via an insulating member 28. The gas supply part 5 forms an upper electrode and faces the lower electrode 33. A high-frequency power supply part 51 is connected to the gas supply part 5 via a matcher 511. The high-frequency power supply part 51 and the upper electrode (gas supply part 5) are configured so that a high-frequency electric field is generated between the upper electrode (gas supply part 5) and the lower electrode 33 by supplying a high-frequency of, for example, 100 [kHz] to 3 [GHz] and 10 to 5000 [W], from the high-frequency power supply part 51 to the upper electrode (gas supply part 5). The gas supply part 5 includes a hollow gas supply chamber 52. On the lower surface of the gas supply chamber 52, a large number of holes 53 for distributing and supplying a process gas into the processing container 2 are equally arranged, for example. A heating mechanism 54 is buried, for example, above the gas supply chamber 52 in the gas supply part 5. The heating mechanism 54 is heated to a preset temperature as electric power is supplied from a power supply part (not shown) based on a control signal from the control part 100.

In the gas supply chamber 52, a gas supply path 6 is provided. The gas supply path 6 communicates with the gas supply chamber 52. A gas source 61 is connected to the upstream side of the gas supply path 6 via a gas line L61 (first gas line). A gas source 62 is connected to the upstream side of the gas supply path 6 via a gas line L62 (second gas line). A gas source 63 is connected to the upstream side of the gas supply path 6 via a gas line L63 (third gas line). In one embodiment, the gas source 61 is a gas source of an inert gas and may be a gas source of, for example, an Ar gas, an $N_2$ gas or the like. The gas source 62 is a gas source of a reactive gas and may be a gas source of, for example, a $H_2$ gas, an $NH_3$ gas or the like. The gas source 62 may also be used as a gas source of an inert gas (an Ar gas, an $N_2$ gas, etc.) for purging purposes. The gas source 63 is a gas source of a reactive gas and may be, for example, a gas source of, for example, a $TiCl_4$ gas or the like. The gas source 63 may also be used as a gas source of an inert gas (an Ar gas, an $N_2$ gas, etc.) for purging purposes. The gas line L61 and the gas line L62 are connected to each other between the valve V1 in the gas line L61 and the gas supply path 6, and between the valve V2 in the gas line L62 and the gas supply path 6.

The gas source 61 is connected to the gas supply path 6 via the gas line L61. A pressure regulation valve V5, a valve V4, a pressure increasing part TK and a valve V1 are provided in the gas line L61 and are arranged in this order from the side of the gas source 61. The pressure increasing part TK is disposed between the valve V1 and the valve V4 in the gas line L61. The valve V4 is disposed between the pressure regulation valve V5 and the pressure increasing part TK. The pressure increasing part TK is used in a step STA of a purging method MT to be described later. The pressure increasing part TK includes a gas storage tank TKT. The gas storage tank TKT of the pressure increasing part TK may store the gas supplied from the gas source 61 via the gas line L61 and the valve V4 in a state in which the valve V1 is closed and the valve V4 is opened, and may increase the pressure of the gas in the gas storage tank TKT. The pressure increasing part TK includes a pressure gauge TKP. The pressure gauge TKP measures the pressure of the gas inside the gas storage tank TKT of the pressure increasing part TK and transmits the measurement result to the control part 100. The valve V1 is disposed between the pressure increasing part TK and the gas supply path 6.

The gas source 62 is connected to the gas supply path 6 via the gas line L62. A valve V6, a mass flow controller MF1 and a valve V2 are provided in the gas line L62 and are arranged in this order from the side of the gas source 62.

The gas source 63 is connected to the gas supply path 6 via the gas line L63. A valve V7, a mass flow controller MF2 and a valve V3 are provided in the gas line L63 and are arranged in this order from the side of the gas source 63.

The substrate processing apparatus 1 includes a control part 100 which includes a program storage part 101. The control part 100 includes a CPU, a RAM, a ROM and the like (not shown). The control part 100 controls the substrate processing apparatus 1 in a comprehensive manner, for example, by causing the CPU to execute a computer program stored in the ROM or the program storage part 101. Specifically, the control part 100 causes the CPU to execute, particularly, the control program stored in the program storage part 101 to control the operation of each component of the above-described substrate processing apparatus 1, thereby performing the respective processes of a first purging method MT1, a second purging method MT2, a third purging method MT3, a fourth purging method MT4 and a fifth purging method MT5 shown in FIGS. 2 to 6.

The purging methods (purging methods MT) of one embodiment shown in FIGS. 2 to 6 are purging methods which are performed after a wafer subjected to a film forming process is unloaded from the interior of a processing container of a substrate processing apparatus that performs a film forming process with respect to a workpiece (hereinafter, "wafer"). In the purging methods MT of one embodiment, it is possible to execute a series of steps using a single substrate processing apparatus (e.g., the substrate processing apparatus 1 shown in FIG. 1).

Figure 2:
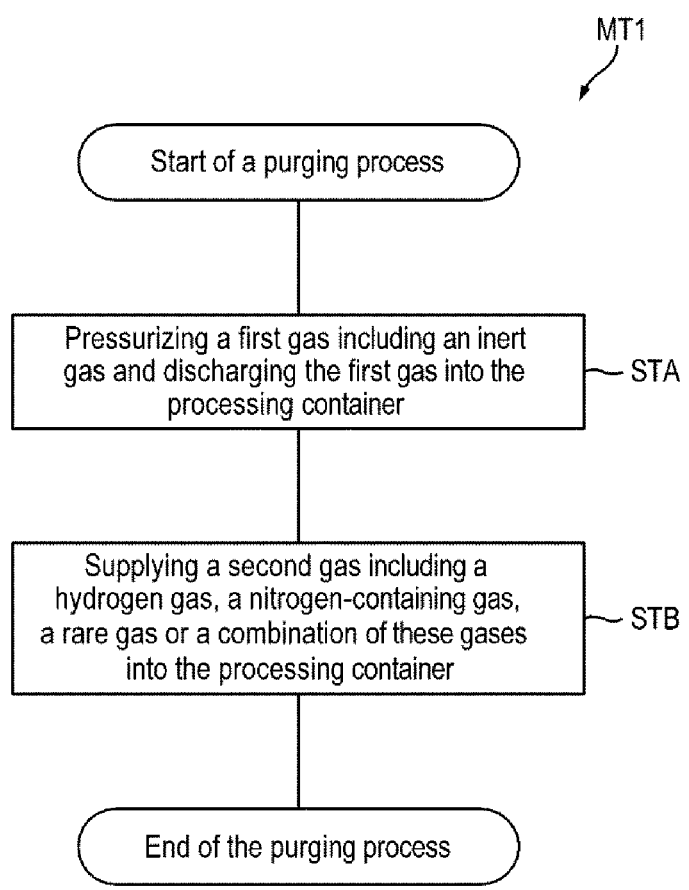
FIG. 2 is a flowchart for explaining example 1 of the purging method of one embodiment.
Figure 3:
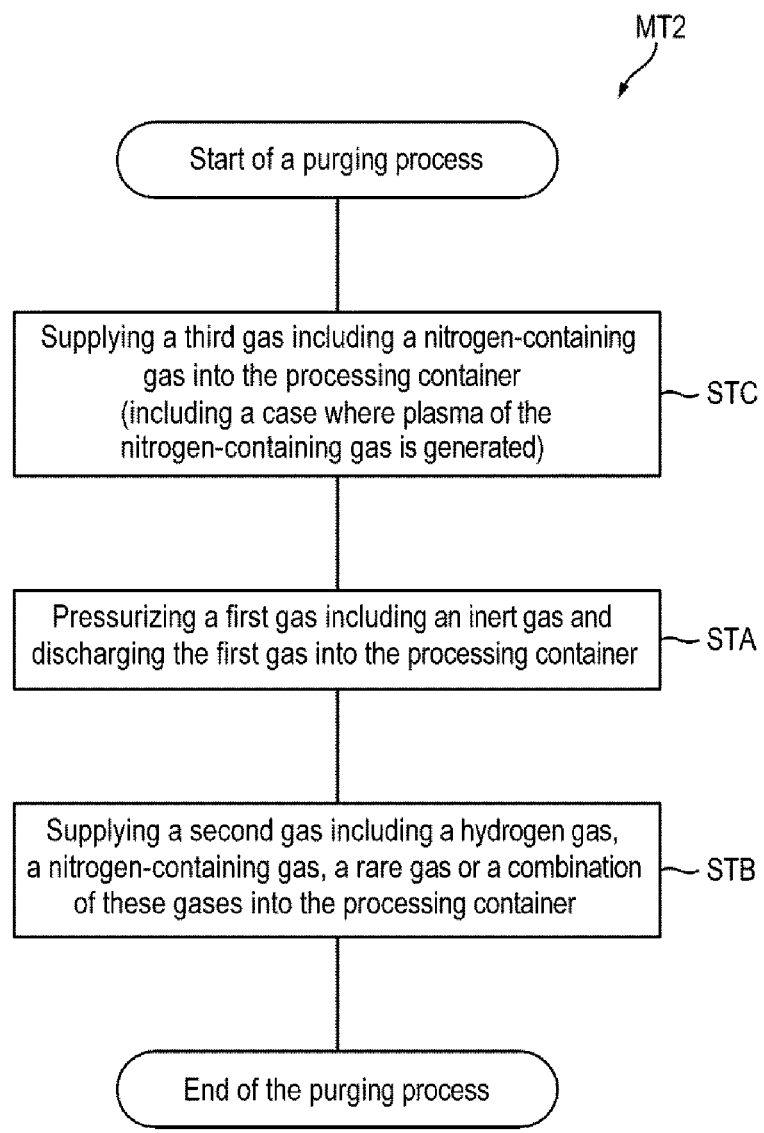
FIG. 3 is a flowchart for explaining example 2 of the purging method of one embodiment.

The purging method (first purging method MT1) shown in FIG. 2 includes a step STA (first step) and a step STB (second step). The step STA is a step of pressurizing a first gas including an inert gas (e.g., an Ar gas or an $N_2$ gas) in a first gas line (gas line L61) and then supplying the pressurized first gas into the processing container 2. The step STB is a step of supplying a second gas including a $H_2$ gas, a nitrogen-containing gas, a rare gas or a combination of these gases into the processing container 2. In the case of the purging methods (the second purging method MT2, the third purging method MT3, the fourth purging method MT4 and the fifth purging method MT5) shown in FIGS. 3 to 6, the purging methods MT further include any one of a step STC (third step), a step STD (fourth step) and a step STE (second step). The step STC is a step of supplying a third gas including a nitrogen-containing gas into the processing container 2. The step STD is a step of filling a fourth gas including an inert gas into one or more second gas lines (the gas line L62 and/or the gas line L63) and then discharging the fourth gas into the processing container 2. The step STE is a step of generating plasma of a second gas including a $H_2$ gas in the processing container 2.

Hereinafter, the purging methods (purging methods MT) of one embodiment will be described with reference to FIGS. 2 to 6.

In the step STA, the pressurized first gas (e.g., Ar gas) in the pressure increasing part TK in which the valve V1 and the valve V4 are closed is discharged into the processing container 2 through the gas line L61 within a relatively short time period (e.g., about 0.2 to 5.0 [sec]) by opening only the valve V1 connected to the gas supply path 6. The pressurization of the first gas by the pressure increasing part TK is performed in advance before the execution of the step STA. For example, the pressurization of the first gas is realized by closing the valve V1, opening the valve V4 and supplying the first gas from the gas source 61 to the pressure increasing part TK within a time period of, for example, about 0.5 to 4.3 [sec] until the pressure in the pressure increasing part TK (specifically in the gas storage tank TKT) becomes about 0.05 to 0.40 [MPa]. Upon completing the pressurization of the first gas by the pressure increasing part TK, the valve V4 is closed, whereby the process proceeds to the step STA in a state in which the valve V1 and the valve V4 are closed. Although the first gas includes an Ar gas, the present disclosure is not limited thereto. The first gas may include other inert gases such as an $N_2$ gas and the like.

The step STB is executed after the execution of the step STA. In the step STB, the valve V1 is closed, the valve V2 and the valve V3 are opened, and a second gas including the gas supplied from the gas source 62 via the gas line L62 and the gas supplied from the gas source 63 via the gas line L63 is supplied into the processing container 2 within a time period of, for example, about 1.0 to 60 [sec]. The gas included in the second gas and supplied from the gas source 62 into the processing container 2 via the gas line L62 is a reactive gas and may be, for example, a gas such as a $H_2$ gas (hydrogen gas), an $NH_3$ gas or the like and a purging-purpose inert gas (an Ar gas, an $N_2$ gas or the like) which is provided in advance in the gas line. The gas included in the second gas and supplied from the gas source 63 into the processing container 2 via the gas line L63 is a reactive gas and may be, for example, a $TiCl_4$ gas and a purging-purpose inert gas (an Ar gas, an $N_2$ gas or the like) which is provided in advance in the gas line. In this way, the second gas may be a combination of a reactive gas and an inert gas.

In the step STC, the valve V1 is closed, the valve V2 and the valve V3 are opened, and a third gas including the gas supplied from the gas source 62 via the gas line L62 and the gas supplied from the gas source 63 via the gas line L63 is supplied into the processing container 2 within a time period of, for example, about 1.0 to 60 [sec]. The gas included in the third gas and supplied from the gas source 62 into the processing container 2 via the gas line L62 is a mixed gas of a $H_2$ gas and an $N_2$ gas. The gas included in the third gas and supplied from the gas source 63 into the processing container 2 via the gas line L63 is an Ar gas. As described above, the third gas is a mixed gas including an $N_2$ gas (a mixed gas including a nitrogen-containing gas). The Ar gas included in the third gas may be other rare gases. The third gas may include a reactive gas such as a $H_2$ gas, an $NH_3$ gas or the like, in addition to the $N_2$ gas.

In the step STC, after a time period of, for example, about 0.1 to 10 [sec] has elapsed from the start of supply of the third gas into the processing container 2, there may be a case where plasma of the third gas is generated between the electrodes in the processing container 2 by using the upper electrode (gas supply part 5) and the lower electrode 33 of the substrate processing apparatus 1. An example of the main conditions used when generating the plasma of the third gas in the step STC is indicated below.

Frequency [kHz] and value [W] of high-frequency power supplied from the high-frequency power supply part 51 to the upper electrode (gas supply part 5): 450 [kHz] and 500 [W]

Figure 4:
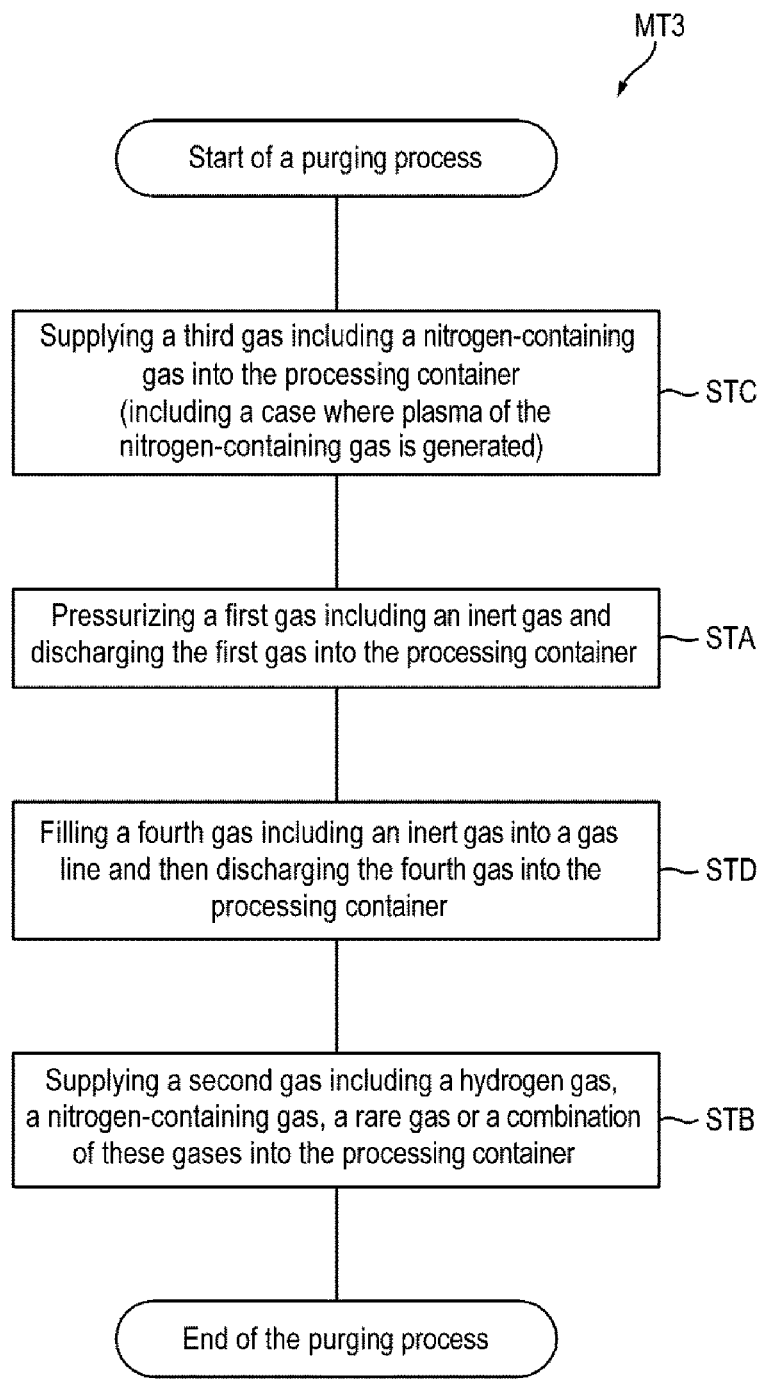
FIG. 4 is a flowchart for explaining example 3 of the purging method of one embodiment.
Figure 6:
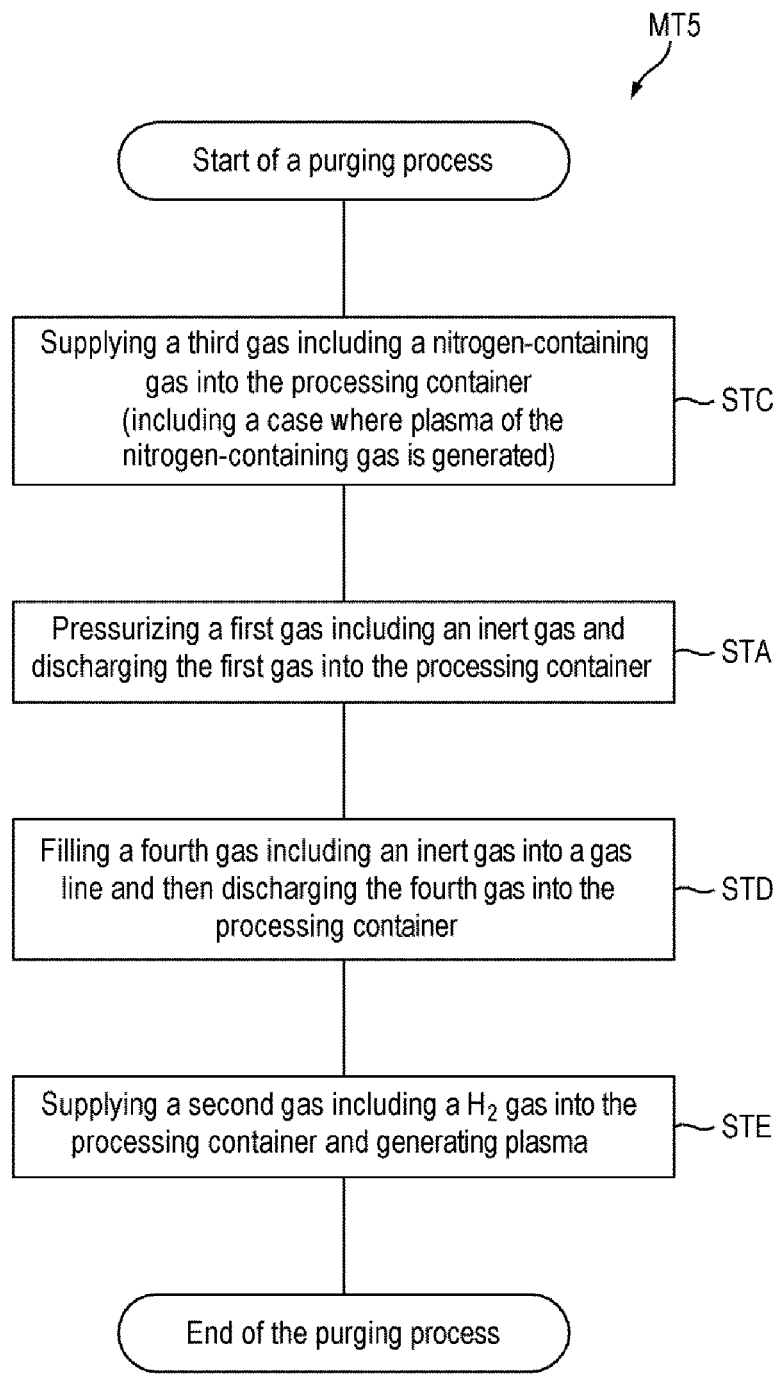
FIG. 6 is a flowchart for explaining example 5 of the purging method of one embodiment.

As shown in the third purging method MT3 of FIG. 4 and the fifth purging method MT5 of FIG. 6, the step STD is executed before the execution of the step STB or the step STE. In the step STD, the valve V2 and the valve V3 are closed, and the filling of the gas from the gas source 62 into the gas line L62 and the filling of the gas from the gas source 63 into the gas line L63 are carried out in parallel within a time period of, for example, about 0.5 to 30 [sec]. Thereafter, the valve V2 and the valve V3 are opened, and a fourth gas including the gas filled into the gas line L62 and the gas filled into the gas line L63 is discharged into the processing container 2 within a time period of, for example, about 5 to 30 [sec]. In the purging methods MT of the embodiment, the step STD is executed after the execution of the step STA as in the third purging method MT3 and the fifth purging method MT5. However, the present disclosure is not limited thereto. The step STD may be executed before the execution of the step STA. In addition, the pressurization in the step STA may be performed in parallel with the pressurization in the step STD. In the above description, in the step STD, the fourth gas is filled into both the gas line L62 and the gas line L63. However, the present disclosure is not limited thereto. The fourth gas may be filled into one of the gas line L62 and the gas line L63. Furthermore, the Ar gas included in the fourth gas may be replaced by other inert gases.

In the step STE, the valve V1 is closed, and the valves V2 and V3 are opened. In this state, the second gas including the gas supplied from the gas source 62 via the gas line L62 and the gas supplied from the gas source 63 via the gas line L63 gas is supplied into the processing container 2 within a time period of, for example, about 1 to 60 [sec]. In one embodiment, the second gas used in the step STE includes a $H_2$ gas. However, the present disclosure is not limited thereto. The second gas used in the step STE may include an inert gas.

In the step STE, plasma of the second gas including a $H_2$ gas may be generated in the processing container 2 by using the upper electrode (gas supply part 5) and the lower electrode 33 of the substrate processing apparatus 1. An example of the main conditions used when generating the plasma of the second gas containing the $H_2$ gas in the step STE is indicated below.

Frequency [kHz] and value [W] of high-frequency power supplied from the high-frequency power supply part 51 to the upper electrode (gas supply part 5): 450 [kHz] and 500 [W]

Example 1

Next, specific example 1 of the purging method MT of one embodiment will be described. In example 1, the film forming process was performed for 100 wafers W. The purging process of the purging method MT was performed 100 times in total for each wafer after the film forming process and the wafer unloading. The number of particles on the $5^{th}$, $25^{th}$, $50^{th}$ and $100^{th}$ wafers W subjected to the film forming process was measured, and the average value of the number of particles was calculated. In the following description, the size of particles was measured for the particles having a particle size of 45 [nm] or more.

In example 1, experiment G11 was performed together with experiment G12 and experiment G13. In the purging process of experiment G12 and the purging process of experiment G13, the third purging method MT3 shown in FIG. 3 was used. In the purging process of experiment G11, steps STC, STB, STD and STA were executed in this order.

Figure 7:
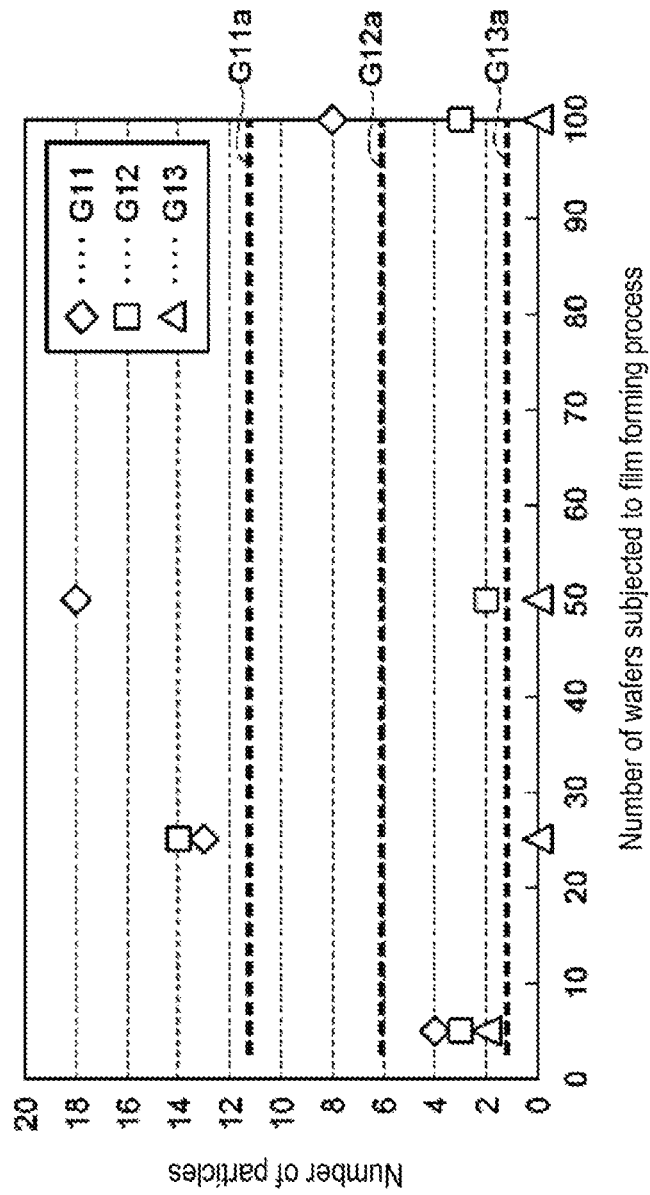
FIG. 7 is a view for explaining the effect achieved by the purging method of one embodiment.

The main process conditions of the step STA used in each of experiment G12 and experiment G13 of example 1 are indicated below.
<Experiment G12>
Preset pressure of the first gas at the time of pressurization by the pressure increasing part TK [MPa]: 0.20 [MPa]
Time for discharging the first gas from the pressure increasing part TK into the processing container 2 [sec]: 0.3 [sec]
Filling time of the first gas in the pressure increasing part TK before the execution of the step STA [sec]: 3.4 [sec]
Type of the first gas: Ar gas
<Experiment G13>
Preset pressure of the first gas at the time of pressurization by the pressure increasing part TK [MPa]: 0.30 [MPa]
Time for discharging the first gas from the pressure increasing part TK into the processing container 2 [sec]: 0.3 [sec]
Filling time of the first gas in the pressure increasing part TK before the execution of the step STA [sec]: 3.4 [sec]
Type of the first gas: Ar gas
The main process conditions of the step STB used in each of experiment G12 and experiment G13 of example 1 are indicated below.
<Experiment G12>
Execution time [sec]: 4.5 [sec]
Type of the second gas: mixed gas of Ar gas and $N_2$ gas
Total flow rate of the second gas [slm]: 12 [slm]
Flow rate of each gas of the second gas [slm]: 7 [slm] (Ar gas) and 5 [slm] ($N_2$ gas)
<Experiment G13>
Execution time [sec]: 4.5 [sec]
Type of the second gas: mixed gas of Ar gas and $N_2$ gas
Total flow rate of the second gas [slm]: 12 [slm]
Flow rate of each gas of the second gas [slm]: 7 [slm] (Ar gas) and 5 [slm] ($N_2$ gas)
The main process conditions of the step STA used in experiment G11 of example 1 are indicated below.
<Experiment G11>
Preset pressure of the first gas at the time of pressurization by the pressure increasing part TK [MPa]: 0.20 [MPa]
Time for discharging the first gas from the pressure increasing part TK into the processing container 2 [sec]: 0.3 [sec]
Filling time of the first gas in the pressure increasing part TK before the execution of the step STA [sec]: 3.4 [sec]
Type of the first gas: Ar gas
The main process conditions of the step STB used in experiment G11 of example 1 are indicated below.
<Experiment G11>
Execution time [sec]: 2.0 [sec]
Type of the second gas: mixed gas of Ar gas and $N_2$ gas
Total flow rate of the second gas [slm]: 10 [slm]
Flow rate of each gas of the second gas [slm]: 6 [slm] (Ar gas) and 4 [slm] ($N_2$ gas)
The results obtained in experiment G12 and experiment G13 of example 1 are indicated below.
Average value of the number of particles obtained in the case of experiment G12: 5.5
Average value of the number of particles obtained in the case of experiment G13: 0.5
The results obtained in experiment G11 of example 1 are indicated below.
Average value of the number of particles obtained in the case of experiment G11: 10.8
FIG. 7 shows the results obtained in example 1. The horizontal axis of FIG. 7 represents the number of wafers subjected to the film forming process, and the vertical axis of FIG. 7 represents the number of particles having a particle size of 45 nm or more, which adhere to the surface of the wafer W after the purging process. In FIG. 7, reference symbol G11 denotes the number of particles obtained in the case of experiment G11, reference symbol G12 denotes the number of particles obtained in the case of experiment G12, and reference symbol G13 denotes the number of particles obtained in the case of experiment G13. Reference symbol G11a denotes the average value of the number of particles obtained in the case of experiment G11, reference symbol G12a denotes the average value of the number of particles obtained in the case of experiment G12, and reference symbol G13a denotes the number of particles obtained in experiment G13.

In the above-described example 1, in experiment G12 and experiment G13, the step STA is executed and the deposits in the processing container 2 are peeled off by applying a shock wave at a relatively high pressure from the surface inside the processing container 2. Thereafter, the step STB is executed and the peeled deposits are removed by using the viscous force of the gas. Therefore, as shown in FIG. 7, the average value of the number of particles is sufficiently reduced. Furthermore, in experiment G13, the pressure of the first gas after pressurization in the step STA is highest. Therefore, the average value of the number of particles is reduced most in example 1 as shown in FIG. 7.

Example 2

Next, specific example 2 of the purging method MT of one embodiment will be described. In example 2, the film forming process was performed for 16 wafers W. The purging process of the purging method MT was performed 16 times in total for each wafer after the film forming process. The number of particles on the $5^{th}$ and $15^{th}$ wafers W subjected to the film forming process was measured, and the average value of the number of particles was calculated.

In example 2, experiment G21 was performed together with experiment G22. In the purging process of experiment G22 and the purging process of experiment G21, the third purging method MT3 shown in FIG. 4 was used.

The main process conditions of the step STA used in experiment G22 of example 2 are indicated below.
<Experiment G22>
  Preset pressure of the first gas at the time of pressurization by the pressure increasing part TK [MPa]: 0.30 [MPa]
  Time for discharging the first gas from the pressure increasing part TK into the processing container 2 [sec]: 0.3 [sec]
  Filling time of the first gas in the pressure increasing part TK before the execution of the step STA [sec]: 3.4 [sec]
  Type of the first gas: Ar gas
  The main process conditions of the step STB used in experiment G22 of example 2 are indicated below.
<Experiment G22>
  Execution time [sec]: 4.5 [sec]
  Type of the second gas: mixed gas of Ar gas, H$_2$ gas and NH$_3$ gas
  Total flow rate of the second gas [slm]: 20.5 [slm]
  Flow rate of each gas of the second gas [slm]: 7 [slm] (Ar gas), 4.5 [slm] (H$_2$ gas) and 9 [slm] (NH$_3$ gas)
  The main process conditions of the step STA used in experiment G21 of example 2 are indicated below.
<Experiment G21>
  Preset pressure of the first gas at the time of pressurization by the pressure increasing part TK [MPa]: 0.30 [MPa]
  Time for discharging the first gas from the pressure increasing part TK into the processing container 2 [sec]: 0.3 [sec]
  Filling time of the first gas in the pressure increasing part TK before the execution of the step STA [sec]: 3.4 [sec]
  Type of the first gas: Ar gas The main process conditions of the step STB used in experiment G21 of example 2 are indicated below.
<Experiment G21>
  Execution time [sec]: 4.5 [sec]
  Type of the second gas: mixed gas of Ar gas and N$_2$ gas
  Total flow rate of the second gas [slm]: 12 [slm]
  Flow rate of each gas of the second gas [slm]: 7 [slm] (Ar gas) and 5 [slm] (N$_2$ gas)
  The results obtained in experiment G22 of example 2 are indicated below.
  Average value of the number of particles obtained in the case of experiment G22: 5.0
  The results obtained in experiment G21 of example 2 are indicated below.
  Average value of the number of particles obtained in the case of experiment G21: 9.5

Figure 8:
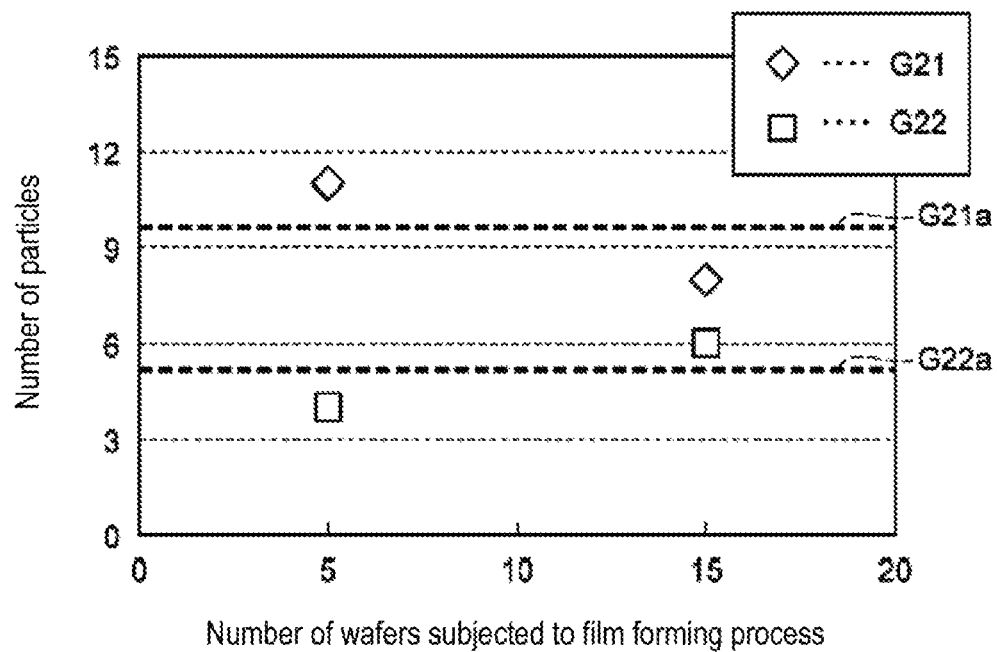
FIG. 8 is a view for explaining the effect achieved by the purging method of one embodiment.

FIG. 8 shows the results obtained in example 2. The horizontal axis of FIG. 8 represents the number of wafers subjected to the film forming process, and the vertical axis of FIG. 8 represents the number of particles having a particle size of 45 nm or more, which adhere to the surface of the wafer W subjected to the film forming process. In FIG. 8, reference symbol G21 denotes the number of particles obtained in the case of experiment G21, and reference symbol G22 denotes the number of particles obtained in the case of experiment G22. Reference symbol G21a denotes the average value of the number of particles obtained in the case of experiment G21, and reference symbol G22a denotes the average value of the number of particles obtained in the case of experiment G22.

In example 2 described above, in experiment G22, the total flow rate of the second gas in the step STB is largest. Therefore, as shown in FIG. 8, the average value of the number of particles is sufficiently reduced.

Example 3

Next, specific example 3 of the purging method MT of one embodiment will be described. In example 3, the film forming process was performed for 12 wafers W. The purging process of the purging method MT was performed 12 times in total for each wafer after the film forming process. The number of particles on the $6^{th}$ and $12^{th}$ wafers W subjected to the film forming process was measured, and the average value of the number of particles was calculated.

In example 3, experiment G31 and experiment G32 were conducted together with experiment G33, experiment G34, experiment G35 and experiment G36. In the purging process of experiment G31 and the purging process of experiment G33, the third purging method MT3 shown in FIG. 4 was used. In the purging process of experiment G32, the purging process of experiment G34, the purging process of experiment G35 and the purging process of experiment G36, the fourth purging method MT4 shown in FIG. 5 was used. Therefore, in experiments G31 and G33, the number of executions of the step STA is one. In experiment G32, experiment G34, experiment G35 and experiment G36, the number of executions of the step STA is two.

The main process conditions of the step STA used in each of experiments G33 to G36 of example 3 are indicated below.
<Experiment G33>
  Preset pressure of the first gas at the time of pressurization by the pressure increasing part TK [MPa]: 0.30 [MPa]
  Time for discharging the first gas from the pressure increasing part TK into the processing container 2 [sec]: 0.3 [sec]

Filling time of the first gas in the pressure increasing part TK before the execution of the step STA [sec]: 3.4 [sec]

Type of the first gas: Ar gas

<Experiment G34>

Preset pressure of the first gas at the time of pressurization by the pressure increasing part TK [MPa]: 0.30 [MPa]

Time for discharging the first gas from the pressure increasing part TK into the processing container 2 [sec]: 0.3 [sec]

Filling time of the first gas in the pressure increasing part TK before the execution of the step STA [sec]: 3.4 [sec]

Type of the first gas: Ar gas

<Experiment G35>

Preset pressure of the first gas at the time of pressurization by the pressure increasing part TK [MPa]: 0.30 [MPa]

Time for discharging the first gas from the pressure increasing part TK into the processing container 2 [sec]: 0.3 [sec]

Filling time of the first gas in the pressure increasing part TK before the execution of the step STA [sec]: 3.9 [sec]

Type of the first gas: Ar gas

<Experiment G36>

Preset pressure of the first gas at the time of pressurization by the pressure increasing part TK [MPa]: 0.35 [MPa]

Time for discharging the first gas from the pressure increasing part TK into the processing container 2 [sec]: 0.3 [sec]

Filling time of the first gas in the pressure increasing part TK before the execution of the step STA [sec]: 3.9 [sec]

Type of the first gas: Ar gas

The main process conditions of the step STB used in each of experiments G33 to G36 of example 3 are indicated below.

<Experiment G33>

Execution time [sec]: 4.5 [sec]

Type of the second gas: mixed gas of Ar gas and $H_2$ gas

Total flow rate of the second gas [slm]: 12 [slm]

Flow rate of each gas of the second gas [slm]: 7 [slm] (Ar gas) and 5 [slm] ($H_2$ gas)

<Experiment G34>

Execution time [sec]: 4.5 [sec]

Type of the second gas: mixed gas of Ar gas and $H_2$ gas

Total flow rate of the second gas [slm]: 12 [slm]

Flow rate of each gas of the second gas [slm]: 7 [slm] (Ar gas) and 5 [slm] ($H_2$ gas)

<Experiment G35>

Execution time [sec]: 4.5 [sec]

Type of the second gas: mixed gas of Ar gas and $H_2$ gas

Total flow rate of the second gas [slm]: 12 [slm]

Flow rate of each gas of the second gas [slm]: 7 [slm] (Ar gas) and 5 [slm] ($H_2$ gas)

<Experiment G36>

Execution time [sec]: 4.5 [sec]

Type of the second gas: mixed gas of Ar gas and $H_2$ gas

Total flow rate of the second gas [slm]: 12 [slm]

Flow rate of each gas of the second gas [slm]: 7 [slm] (Ar gas) and 5 [slm] ($H_2$ gas)

The main process conditions of the step STA used in each of experiments G31 and G32 of example 3 are indicated below.

<Experiment G31>

Preset pressure of the first gas at the time of pressurization by the pressure increasing part TK [MPa]: 0.30 [MPa]

Time for discharging the first gas from the pressure increasing part TK into the processing container 2 [sec]: 0.3 [sec]

Filling time of the first gas in the pressure increasing part TK before the execution of the step STA [sec]: 3.4 [sec]

Type of the first gas: Ar gas

<Experiment G32>

Preset pressure of the first gas at the time of pressurization by the pressure increasing part TK [MPa]: 0.30 [MPa]

Time for discharging the first gas from the pressure increasing part TK into the processing container 2 [sec]: 0.3 [sec]

Filling time of the first gas in the pressure increasing part TK before the execution of the step STA [sec]: 4.4 [sec]

Type of the first gas: Ar gas

The main process conditions of the step STB used in each of experiments G31 and G32 of example 3 are indicated below.

<Experiment G31>

Execution time [sec]: 4.5 [sec]

Type of the second gas: mixed gas of Ar gas and $N_2$ gas

Total flow rate of the second gas [slm]: 12 [slm]

Flow rate of each gas of the second gas [slm]: 7 [slm] (Ar gas) and 5 [slm] ($N_2$ gas)

<Experiment G32>

Execution time [sec]: 4.5 [sec]

Type of the second gas: mixed gas of Ar gas and $H_2$ gas

Total flow rate of the second gas [slm]: 12 [slm]

Flow rate of each gas of the second gas [slm]: 7 [slm] (Ar gas) and 5 [slm] ($H_2$ gas)

The results obtained in each of experiments G33 to G36 of example 3 are indicated below.

Average value of the number of particles obtained in the case of experiment G33: 9.0

Average value of the number of particles obtained in the case of experiment G34: 4.5

Average value of the number of particles obtained in the case of experiment G35: 4.5

Average value of the number of particles obtained in the case of experiment G36: 4.0

The results obtained in each of experiments G31 and G32 of example 3 are indicated below.

Average value of the number of particles obtained in the case of experiment G31: 13.5

Average value of the number of particles obtained in the case of experiment G32: 57.0

Figure 9:
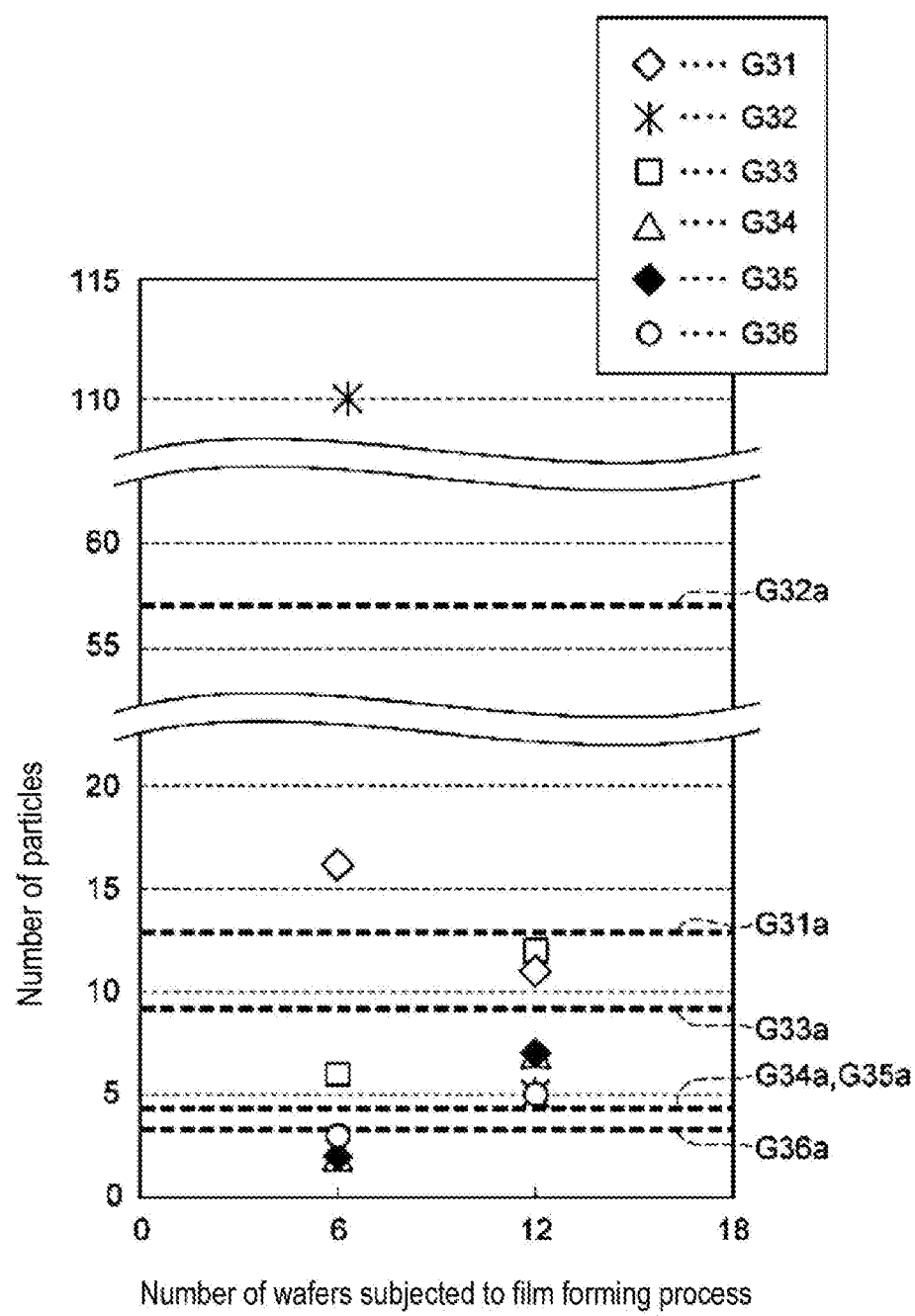
FIG. 9 is a view for explaining the effect achieved by the purging method of one embodiment.
Figure 10:
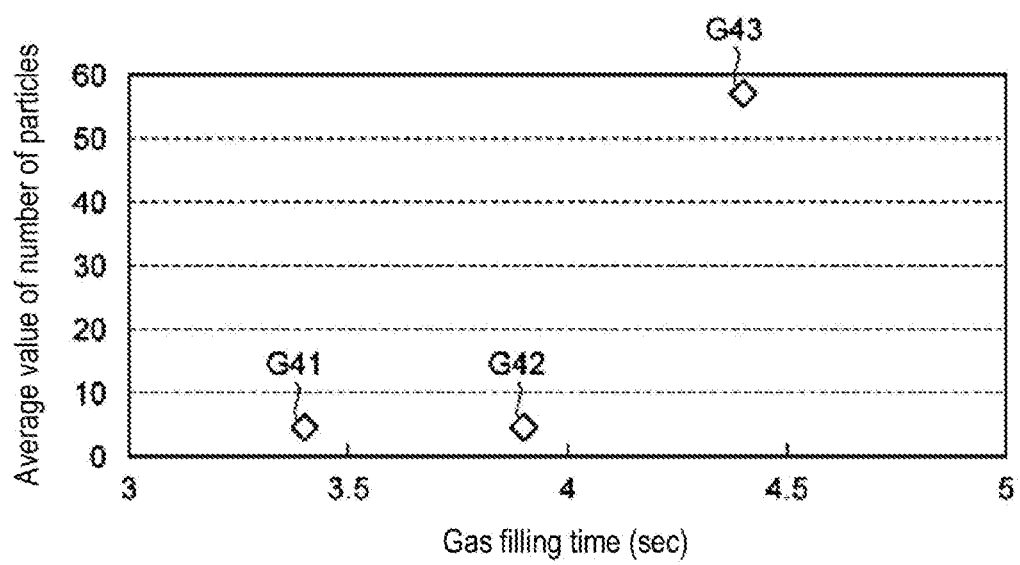
FIG. 10 is a view for explaining the effect achieved by the purging method of one embodiment.

In FIG. 9, the results obtained in example 3 are shown. The horizontal axis of FIG. 9 represents the number of wafers subjected to the film forming process, and the vertical axis of FIG. 9 represents the number of particles having a particle size of 45 nm or more, which adhere to the surface of the wafer W subjected to the film forming process. In FIG. 9, reference symbol G31 denotes the number of particles obtained in the case of experiment G31, and reference symbol G32 denotes the number of particles obtained in the case of experiment G32. Reference symbol G33 denotes the number of particles obtained in the case of experiment G33, reference symbol G34 denotes the number of particles obtained in the case of experiment G34, reference symbol G35 denotes the number of particles obtained in the case of experiment G35, and reference symbol G36 denotes the number of particles obtained in the case of experiment G36. Furthermore, reference symbol G31a denotes the average value of the number of particles obtained in the case of experiment G31, reference symbol G32a denotes the average value of the number of particles obtained in the case of experiment G32, reference symbol G33a denotes the average value of the number of particles obtained in the case of experiment G33, reference symbol G34a denotes the average value of the number of particles obtained in the case of experiment G34, reference symbol G35a denotes the average value of the number of particles obtained in the case of experiment G35, and reference symbol G36a denotes the average value of the number of particles obtained in the case of experiment G36. FIG. 10 also shows the results obtained in example 3. The horizontal axis of FIG. 10 represents the filling time [sec] of the first gas in the pressure increasing part TK, and the vertical axis of FIG. 10 represents the average value of the number of particles having a particle diameter of 45 [nm] or more, which adhere to the surface of the wafer W subjected to the film forming process. In FIG. 10, reference symbol G41 denotes the average value of the number of particles obtained in the case of experiment G34, reference symbol G42 denotes the average value of the number of particles obtained in the case of experiments G35 and G36, and reference symbol G43 denotes the average value of the number of particles obtained in the case of experiment G32.

Figure 5:
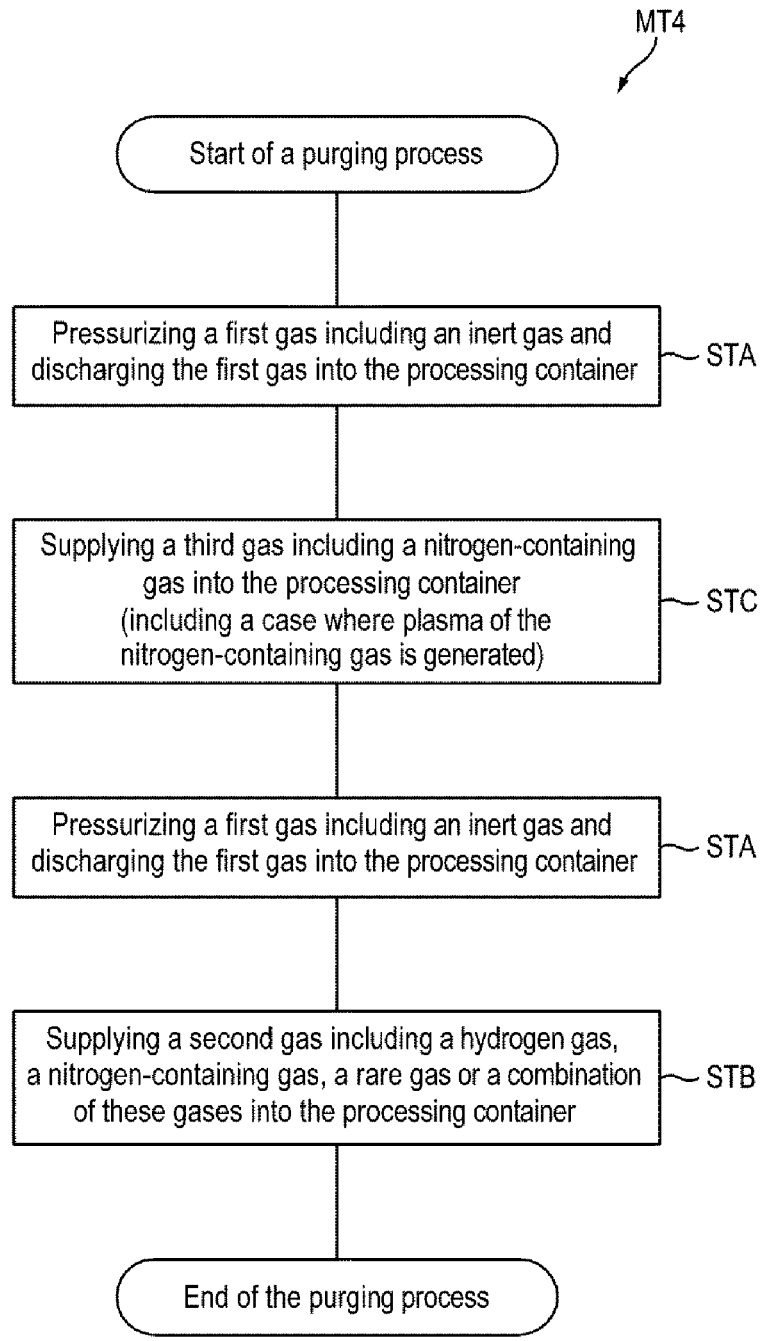
FIG. 5 is a flowchart for explaining example 4 of the purging method of one embodiment.

In example 3 described above, regardless of the experiment (experiment G33 and experiment G31) using the third purging method MT3 shown in FIG. 4 or the experiment (experiments G34 to G36 and experiment G32) using the fourth purging method MT4 shown in FIG. 5, experiments G33 to G36 using the $H_2$ gas as the second gas in the step STB are lower in the average value of the number of particles than experiment G31 using the $N_2$ gas as the second gas in the step STB as shown in FIG. 9. In example 3, when the filling time of the first gas in the pressure increasing part TK before the execution of the step STA is relatively longer than the filling time in the case of experiments G33 to G36 and experiment G31 as in the case of experiment G32 (when the filling time is 4.4 [sec] or more in example 3), as shown in FIG. 10, the average value of the number of particles is increased regardless of the experiment (experiment G33 and experiment G31) using the third purging method MT3 shown in FIG. 4 or the experiment (experiments G34 to G36 and experiment G32) using the fourth purging method MT4 shown in FIG. 5. Furthermore, in example 3, when the pressure of the first gas at the time of pressurization by the pressure increasing part TK in the step STA is a relatively higher pressure than the pressure in the case of experiments G33 to G35, G31 and G32 (0.30 [MPa]) as in the case of experiment G36 (0.35 [MPa]), the average value of the number of particles is reduced regardless of the experiment (experiment G33 and experiment G31) using the third purging method MT3 shown in FIG. 4 or the experiment (experiments G34 to G36 and experiment G32) using the fourth purging method MT4 shown in FIG. 5. Regarding the intensity of the purging in the step STA and the step STD, the numerical value of (the filling time of the gas in the pressure increasing part TK)×(the preset pressure at the time of pressurization) is a criterion because the particles are peeled off by applying the shock wave. In example 3, an increase in particles was confirmed when the filling time is 4.4 [sec] or more. Therefore, if the numerical value of (the filling time of the gas in the pressure increasing part TK)×(the preset pressure at the time of pressurization) exceeds 1.3, the risk of particle generation increases. Presumably, this is because the power of the shock wave is too high, the deposits in the processing container 2 are peeled off beyond the particle removal ability by the viscous force of the gas in the subsequently-executed step STB, and the particles that cannot be removed by the viscous force of the gas adhered to the wafer W subjected to the film forming process.

Example 4

Next, specific example 4 of the purging method MT of one embodiment will be described. In example 4, the film forming process was performed for 12 wafers W. The purging process of the purging method MT was performed 12 times in total for each wafer after the film forming process. The number of particles on the 6$^{th}$ and 12$^{th}$ wafers W subjected to the film forming process was measured, and the average value of the number of particles was calculated.

In example 4, experiment G51 was performed together with experiment G52. In the purging process of experiment G52, the fifth purging method MT5 shown in FIG. 6 was used. In the purging process of experiment G51, the third purging method MT3 shown in FIG. 4 was used.

Figure 11:
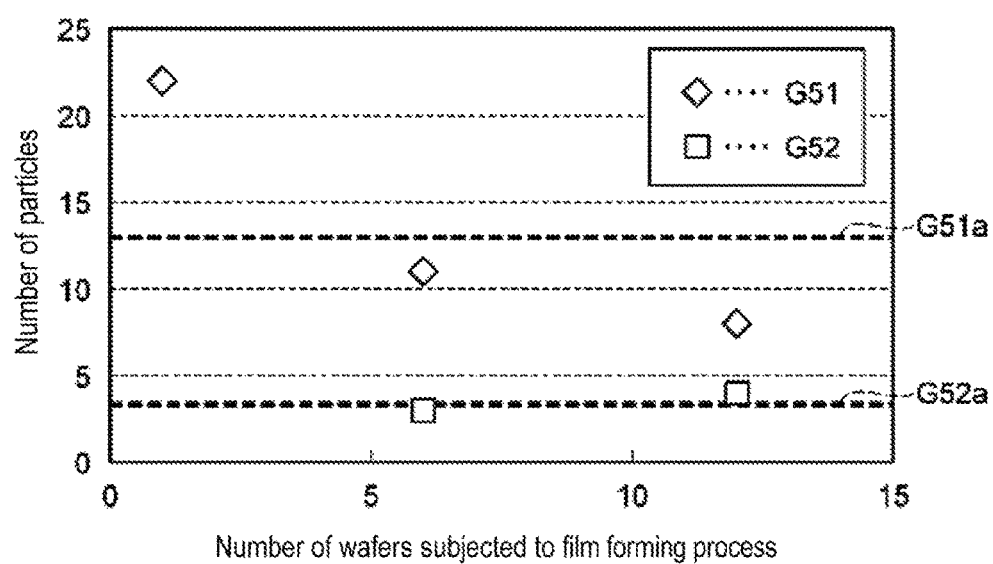
FIG. 11 is a view for explaining the effect achieved by the purging method of one embodiment.

The main process conditions of the step STA used in experiment G52 of example 4 are indicated below.
<Experiment G52>
  Preset pressure of the first gas at the time of pressurization by the pressure increasing part TK [MPa]: 0.35 [MPa]
  Time for discharging the first gas from the pressure increasing part TK into the processing container 2 [sec]: 0.3 [sec]
  Filling time of the first gas in the pressure increasing part TK before the execution of the step STA [sec]: 3.9 [sec]
  Type of the first gas: Ar gas
  The main process conditions of the step STE used in experiment G52 of example 4 are indicated below.
<Experiment G52>
  Execution time [sec]: 10.0 [sec]
  Gas type of the second gas: mixed gas of Ar gas and $H_2$ gas
  Total flow rate of second gas [slm]: 6 [slm]
  Flow rate of each gas of the second gas [slm]: 1 [slm] (Ar gas) and 5 [slm] ($H_2$ gas)
  Frequency [kHz], value [W] and value per unit area [W/cm$^2$] of the high-frequency power supplied from the high-frequency power supply part 51 to the upper electrode (the gas supply part 5): 450 [kHz], 500 [W] and 0.55 [W/cm$^2$]
  The main process conditions of the step STA used in experiment G51 of example 4 are indicated below.
<Experiment G51>
  Preset pressure of the first gas at the time of pressurization by the pressure increasing part TK [MPa]: 0.35 [MPa]
  Time for discharging the first gas from the pressure increasing part TK into the processing container 2 [sec]: 0.3 [sec]
  Filling time of the first gas in the pressure increasing part TK before the execution of the step STA [sec]: 3.9 [sec]
  Type of the first gas: Ar gas
  The main process conditions of the step STE used in experiment G51 of example 4 are indicated below.
<Experiment G51>
  Execution time [sec]: 4.5 [sec]
  Gas type of the second gas: mixed gas of Ar gas and $H_2$ gas
  Total flow rate of second gas [slm]: 12 [slm]
  Flow rate of each gas of the second gas [slm]: 7 [slm] (Ar gas) and 5 [slm] ($H_2$ gas)
  (The high-frequency power supply part not used)
  The results obtained in experiment G52 of example 4 are indicated below
  Average value of the number of particles obtained in the case of experiment G52: 3.5
  The results obtained in experiment G51 of example 4 are indicated below.
  Average value of the number of particles obtained in the case of experiment G51: 13.7
In FIG. 11, the results obtained in example 4 are shown. The horizontal axis of FIG. 11 represents the number of wafers subjected to the film forming process, and the vertical axis of FIG. 11 represents the number of particles having a particle size of 45 nm or more, which adheres to the surface of the wafer W subjected to the film forming process. In FIG. 11, reference symbol G51 denotes the number of particles obtained in the case of experiment G51, reference symbol G52 denotes the number of particles obtained in the case of experiment G52, reference symbol G51a denotes the average value of the number of particles obtained in the case of experiment G51, and reference symbol G52a denotes the average value of the number of particles obtained in the case of the experiment G52.

In example 4 described above, no plasma was used in experiment G51. However, plasma was used in the step STE corresponding to the step STB in experiment G52. The ratio of the $H_2$ gas in the step STB and the step STE is larger and the execution time is longer in the case of experiment G52 than in the case of experiment G51. Thus, the effect is higher in the case of experiment G52 than in the case of experiment G51.

In the above-described examples 1 to 4, the step STD is executed after executing the step STA. However, both the step STA and the step STD are techniques by which particles are peeled off by pressurizing and accumulating the gas in the pressure increasing part TK or the gas pipe and then discharging the gas into the processing container 2 to form a shock wave. Therefore, either the step STA or the step STD may be performed first. Furthermore, each step may be executed once or a plurality of times. However, when the number of executions of the step STA or the step STD is increased, the interval of the film forming processes of the wafer W becomes long, which leads to a decrease in throughput. Thus, it is not preferable to increase the number of executions of the step STA or the step STD. Following the purging steps STA and STD for generating these shock waves, the step of causing the gas to flow in a large amount is executed as in the step STB and the step STE, and the particles peeled off by the viscous force of the gas are discharged together with the gas. It is effective to execute the purging in this order. Furthermore, it is desirable that the step of generating the shock wave and the subsequently-executed step of discharging the particles using the viscous force of the gas are consistently performed in a pressure region where the gas shows the viscous flow characteristic. Thus, it is possible to discharge the peeled-off particles together with the gas without dropping them into the processing container 2. In addition, since the gas line L61 independent of the gas line used in the film forming process is used in the step STA, it is possible to perform the filling of the gas line L61 beforehand during the film forming process on the wafer W. When the step STA is executed a plurality of times, the step STB is executed after the execution of the step STA which is executed last among the steps STA to be executed a plurality of times. In the purging method MT of one embodiment, in each of the first purging method MT1, the second purging method MT2 and the fourth purging method MT4, the step STD may be executed before the execution of the step STB or the step STE.

The step STC suppresses vaporization of deposits adhered to the processing container 2 at the time of film formation and stabilizes the deposits. Therefore, when the step STC is combined with other steps, it is desirable to execute the step STC first. By executing the step STC first, it is possible to first stabilize the deposits in the processing container 2 and to efficiently remove the particles by the subsequent steps. However, the order of combinations is not limited thereto. The step STC may be subsequently executed after peeling off or removing the particles by other steps. Specifically, in the purging method MT of one embodiment, the step STC is executed before or after the execution of the step STA, or before or after the execution of the step STB. Furthermore, the step STC is executed at least once in the purging method MT. In the purging method MT of one embodiment, when the step STA is executed a plurality of times, the process STC is executed at least once during the period in which the step STA is executed a plurality of times. As for the step STB included in the purging method MT of one embodiment, the step STE may be used without using the step STB.

Specific process conditions of the step STC and the step STD are as follows. Main process conditions of the step STC:

Execution time [sec]: 3.0 [sec]
Type of the third gas: mixed gas of Ar gas, $H_2$ gas and $N_2$ gas
Total flow rate of the third gas [slm]: 7.6 [slm]
Flow rate of each gas of the third gas [slm]: 1.6 [slm] (Ar gas), 4.0 [slm] ($H_2$ gas) and 2.0 [slm] ($N_2$ gas)
Preset pressure of the processing container 2 at the time of executing the step STC [Pa]: 333 [Pa]
Frequency [kHz] and value [W] of the high-frequency power supplied from the high-frequency power supply part 51 to the upper electrode (gas supply part 5): 450 [kHz] and 1350 [W]

Main process conditions of the step STD:
Filling time of the fourth gas [sec]: 2.0 [sec]
Type of the filling gas to filled into the gas line L62: Ar gas
Type of the filling gas to filled into the gas line L63: Ar gas
Preset pressure of the filling gas at the time of pressurization of the gas line L62 [MPa]: 0.07 [MPa]
Preset pressure of the filling gas at the time of pressurization of the gas line L63 [MPa]: 0.07 [MPa]
Time for discharging the fourth gas into the processing container 2 [sec]: 0.1 [sec]

The preset pressure for filling the gas at the time of pressurization of the gas line L62 and the gas line L63 is not limited to the above value but may be set between 0.05 and 0.5 [MPa]. In the above description, the time for discharging the pressurized fourth gas into the processing container 2 is set to 0.1 [sec]. However, following the discharging, an inert gas may be caused to flow from the gas line L62 and the gas line L63 in order to maintain the pressure inside the processing container 2 in a viscous flow region. In that case, for example, an Ar gas may be caused to flow from the gas line L62 at a flow rate of 2000 sccm for 6.0 sec, and an Ar gas may be caused to flow from the gas line L63 at a flow rate of 2000 sccm for 6.0 sec. During that time, the valve V2 and the valve V3 for discharging the fourth gas into the processing container 2 are kept in an open state. Therefore, the time for discharging the fourth gas into the processing container 2 is 6.1 [sec] in total.

According to the present disclosure in some embodiments, it is possible to provide a purging process for further reducing particle contamination.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A purging method for purging an interior of a processing container of a substrate processing apparatus after a film forming process is executed on a wafer in the processing container, comprising:
    a first process of pressurizing, by a pressurizer, a first gas that has been supplied from a first gas source which is connected to a first line of the substrate processing apparatus, and then discharging the pressurized first gas into the processing container; and
    a second process of supplying a second gas, which has been supplied from a second gas source through a second line of the substrate processing apparatus, into the processing container,
    wherein the first gas includes an inert gas, and the second gas includes a hydrogen gas, a nitrogen-containing gas, a rare gas or a combination of these gases,
    wherein the first process is executed a plurality of times,
    wherein the second process is executed after executing the first process the plurality of times, and
    wherein the first process and the second process are performed after the wafer subjected to the film forming process is unloaded from the interior of the processing container.

2. The method of claim 1, further comprising:
    a third process of supplying a third gas into the processing container,
    wherein the third process is executed before or after execution of the first process or before or after execution of the second process and is executed once or a plurality of times, and the third gas includes a nitrogen-containing gas.

3. The method of claim 1, further comprising:
    a fourth process of filling a fourth gas into one or more second gas lines of the substrate processing apparatus and then discharging the fourth gas into the processing container,
    wherein the fourth process is executed before execution of the second process, and the fourth gas includes an inert gas.

4. The method of claim 1, wherein the second gas includes a hydrogen gas, and plasma of the second gas is generated in the second process.

5. The method of claim 1, wherein the rare gas is an Ar gas.

6. The method of claim 1, wherein the inert gas is an Ar gas or an $N_2$ gas.

7. The method of claim 1, wherein the first gas line includes the pressurizer.

8. The method of claim 2, wherein in the third process, plasma of the third gas is generated.

9. The method of claim 2, wherein the third process is executed at least once while the first process is executed a plurality of times.

10. A purging apparatus for purging an interior of a processing container of a substrate processing apparatus after a film forming process is executed on a wafer in the processing container, the apparatus comprising:
    a first gas source configured to supply a first gas through a first line;
    a pressurizer connected to the first line and configured to pressurize the first gas that has been supplied from the first gas source, and then discharge the pressurized first gas into the processing container; and
    a second gas source configured to supply a second gas through a second line into the processing container,
    wherein a first process of discharging the pressurized first gas into the processing container by the pressurizer is executed before a second process of supplying the second gas into the processing container without pressurizing the second gas by the second gas source,
    wherein the first gas includes an inert gas, and the second gas includes a hydrogen gas, a nitrogen-containing gas, a rare gas or a combination of these gases, and
    wherein the first process and the second process are performed after the wafer subjected to the film forming process is unloaded from the interior of the processing container.

11. The purging apparatus of claim 10, wherein the first process is executed a plurality of times.

12. The purging apparatus of claim 10, further comprising a third gas source configured to supply a third gas including a nitrogen-containing gas into the processing container,
    wherein a third process of supplying the third gas into the processing container by the third gas source is executed before or after execution of the first process or before or after execution of the second process and is executed once or a plurality of times.

13. The purging apparatus of claim 10, wherein a fourth gas including an inert gas is filled into the second gas line and then discharged into the processing container, and
    wherein a forth process of filling and discharging the fourth gas is executed before execution of the second process.

14. The purging apparatus of claim 10, wherein the second gas includes hydrogen gas, and plasma of the second gas is generated in the second process.

15. The purging apparatus of claim 10, wherein the pressurizer includes a gas storage tank and a pressure gauge.

16. The purging apparatus of claim 10, wherein the rare gas is an Ar gas and the inert gas is an Ar gas or an $N_2$ gas.

17. The purging apparatus of claim 11, wherein the second process is executed after executing the first process the plurality of times.

18. The purging apparatus of claim 12, wherein plasma of the third gas is generated in the third process, and the third process is executed at least once while the first process is executed a plurality of times.

* * * * *